United States Patent
Moon et al.

(10) Patent No.: US 11,651,832 B2
(45) Date of Patent: May 16, 2023

(54) MEMORY DEVICE AND TEST METHOD THEREOF

(71) Applicant: SK hynix Inc., Gyeonggi-do (KR)

(72) Inventors: Hong Ki Moon, Gyeonggi-do (KR); Seung Woo Lee, Gyeonggi-do (KR); Dong Hee Han, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 19 days.

(21) Appl. No.: 17/146,958

(22) Filed: Jan. 12, 2021

(65) Prior Publication Data

US 2022/0059178 A1 Feb. 24, 2022

(30) Foreign Application Priority Data

Aug. 18, 2020 (KR) .................. 10-2020-0103233

(51) Int. Cl.
| | | |
|---|---|---|
| *G11C 29/42* | (2006.01) | |
| *G11C 29/44* | (2006.01) | |
| *G11C 8/18* | (2006.01) | |
| *G11C 29/12* | (2006.01) | |
| *G11C 7/10* | (2006.01) | |
| *G11C 29/46* | (2006.01) | |

(52) U.S. Cl.
CPC ............. *G11C 29/42* (2013.01); *G11C 7/106* (2013.01); *G11C 8/18* (2013.01); *G11C 29/12015* (2013.01); *G11C 29/44* (2013.01); *G11C 29/46* (2013.01)

(58) Field of Classification Search
CPC ...................................... G11C 29/42
USPC .................................... 365/185.09
See application file for complete search history.

(56) References Cited

U.S. PATENT DOCUMENTS

| | | | |
|---|---|---|---|
| 8,201,033 B2 | 6/2012 | Earle et al. | |
| 10,276,259 B2 | 4/2019 | Chan | |
| 2010/0235695 A1* | 9/2010 | Lee ................. | G11C 29/44 |
| | | | 714/763 |
| 2011/0258515 A1* | 10/2011 | Earle ............... | G06F 11/1048 |
| | | | 714/763 |
| 2015/0067448 A1* | 3/2015 | Son ................. | G11C 29/52 |
| | | | 714/773 |
| 2018/0268917 A1* | 9/2018 | Lee ................. | G11C 29/24 |

FOREIGN PATENT DOCUMENTS

| | | |
|---|---|---|
| KR | 10-2008-0007806 | 1/2008 |
| KR | 10-2018-0070423 | 6/2018 |

* cited by examiner

*Primary Examiner* — Muna A Techane
(74) *Attorney, Agent, or Firm* — IP & T Group LLP

(57) ABSTRACT

A memory device includes: a normal cell region suitable for storing write data and outputting read data; a parity cell region suitable for storing write parity bits and outputting read parity bits; a pattern generation circuit suitable for generating test data whose value is sequentially increased, and providing the test data as the write data, in a first test mode; an error correction circuit suitable for generating the write parity bits based on the write data, correcting an error of the read data based on the read parity bits, and outputting the error-corrected data; and an output circuit suitable for compressing the error-corrected data and outputting the compressed data, wherein the output circuit is further suitable for compressing the read parity bits output from the parity cell region to output the compressed data, in the first test mode.

21 Claims, 13 Drawing Sheets

MEMORY DEVICE AND TEST METHOD THEREOF

CROSS-REFERENCE TO RELATED APPLICATION

The present application claims priority under 35 U.S.C. § 119 on Korean Patent Application No. 10-2020-0103233, filed on Aug. 18, 2020, which is incorporated herein by reference in its entirety.

BACKGROUND

1. Field

Various embodiments of the present invention relate to semiconductor design technology, and more particularly, to a method for testing a memory device employing an On-Chip Error Correction Code (ECC) scheme.

2. Description of the Related Art

As the size of a memory device is reduced, error-containing data may be randomly generated, thereby increasing soft errors. In order to solve this problem, an On-Chip Error Correction Code (ECC) scheme having an ECC function within a memory device has been adopted recently. In other words, in order to prolong its life, the memory device may perform a repair operation of replacing repair target memory cells to be repaired with redundant memory cells or data itself may be corrected based on an on-chip ECC scheme, To implement the on-chip ECC scheme, parity bits for error correction code (ECC) may be allocated to and stored in a particular space. In particular, in a memory device employing an on-chip ECC scheme, a method of allocating and storing ECC parity bits to and in some memory areas of a memory array area (parity cell region) may be used.

Also, a memory device generally goes through a memory device test that measures various characteristics of the structures of the memory device formed over a semiconductor substrate, when all fabrication processes are completed. Through the memory device test, the through-put of the memory device may be increased by detecting defects in the processes such as a fabrication process or an assembly process of a semiconductor substrate. In particular, in a wafer-level test for testing a memory device in a wafer state among the tests of the memory device test, a parallel bit test (PBT) may be performed to reduce the test time. According to the parallel bit test (PBT), specific test data may be written into all memory cells during a write operation, and test data output through a global data line during a read operation may be compared so as to determine pass or failure.

In the case of a memory device employing an on-chip ECC scheme, since a parallel bit test (PBT) operation for verifying the integrity of an error correction circuit is more complicated than a parallel bit test operation of a general memory device, it takes more time to perform the parallel bit test operation. Therefore, what is needed is a method for efficiently testing a memory device employing an on-chip ECC scheme.

SUMMARY

Embodiments of the present invention are directed to a method for efficiently testing a memory device employing an on-chip ECC scheme based on an internally generated clock.

In accordance with an embodiment of the present invention, a memory device includes: a normal cell region suitable for storing a write data and outputting read data; a parity cell region suitable for storing write parity bits and outputting read parity bits; a pattern generation circuit suitable for generating test data whose value is sequentially increased, and providing the test data as the write data, in a first test mode; an error correction circuit suitable for generating the write parity bits based on the write data, correcting an error of the read data based on the read parity bits, and outputting the error-corrected data; and an output circuit suitable for compressing the error-corrected data and outputting the compressed data, wherein the output circuit is further suitable for compressing the read parity bits output from the parity cell region to output the compressed data, in the first test mode.

In accordance with another embodiment of the present invention, a memory device includes: a plurality of banks, each bank including: a normal cell region suitable for storing write data and outputting read data, a parity cell region suitable for storing write parity bits and outputting read parity bits, an error correction circuit suitable for generating the write parity bits based on the write data, correcting an error of the read data based on the read parity bits, and outputting the error-corrected data, and a data output circuit suitable for outputting the error-corrected data to test data lines, and mapping and outputting, in a first test mode, the read parity bits to some lines among the test data lines; a pattern generation circuit suitable for generating test data whose value is sequentially increased and providing the test data as the write data to each of the banks, in the first test mode; and a test output circuit suitable for compressing the error-corrected data on the test data lines to output the compressed data, and compressing, in the first test mode, the read parity bits on the test data lines to output the compressed data.

In accordance with yet another embodiment of the present invention, a method for testing a memory device including a normal cell region and a parity cell region includes: providing the test data as write data; generating write parity bits based on the write data; writing the write data and the write parity bits into the normal cell region and the parity cell region, respectively, according to a write enable signal; outputting read parity bits from the parity cell region according to a read strobe signal; generating compressed data by compressing the read parity bits; and latching the compressed data and outputting the latched data to a data pad according to a test output signal.

In accordance with still another embodiment of the present invention, a method for testing a memory device including a normal cell region and a parity cell region includes: generating test data whose value is sequentially increased; masking read parity bits output from the parity cell region; masking read data output from the normal cell region; outputting the masked data; correcting an error of the masked data based on the test data; generating compressed data by compressing the error-corrected data; and latching the compressed data and outputting the latched data to a data pad according to a test output signal.

In accordance with still another embodiment of the present invention, an operating method of a memory device includes: generating data whose value is sequentially increased according to cycles of a clock; encoding the data to generate original parity; storing the original parity in the memory device; reading parity, which corresponds to the original parity, from the memory device; and determining integrity of the encoding by comparing the read parity with the original parity.

In accordance with still another embodiment of the present invention, an operating method of a memory device includes: generating parity whose value is sequentially increased according to cycles of a clock; decoding original data containing bits of the same logic level with the parity to generate decoded data; and determining integrity of the decoding by comparing the decoded data with the original data.

DETAILED DESCRIPTION

Figure 1:
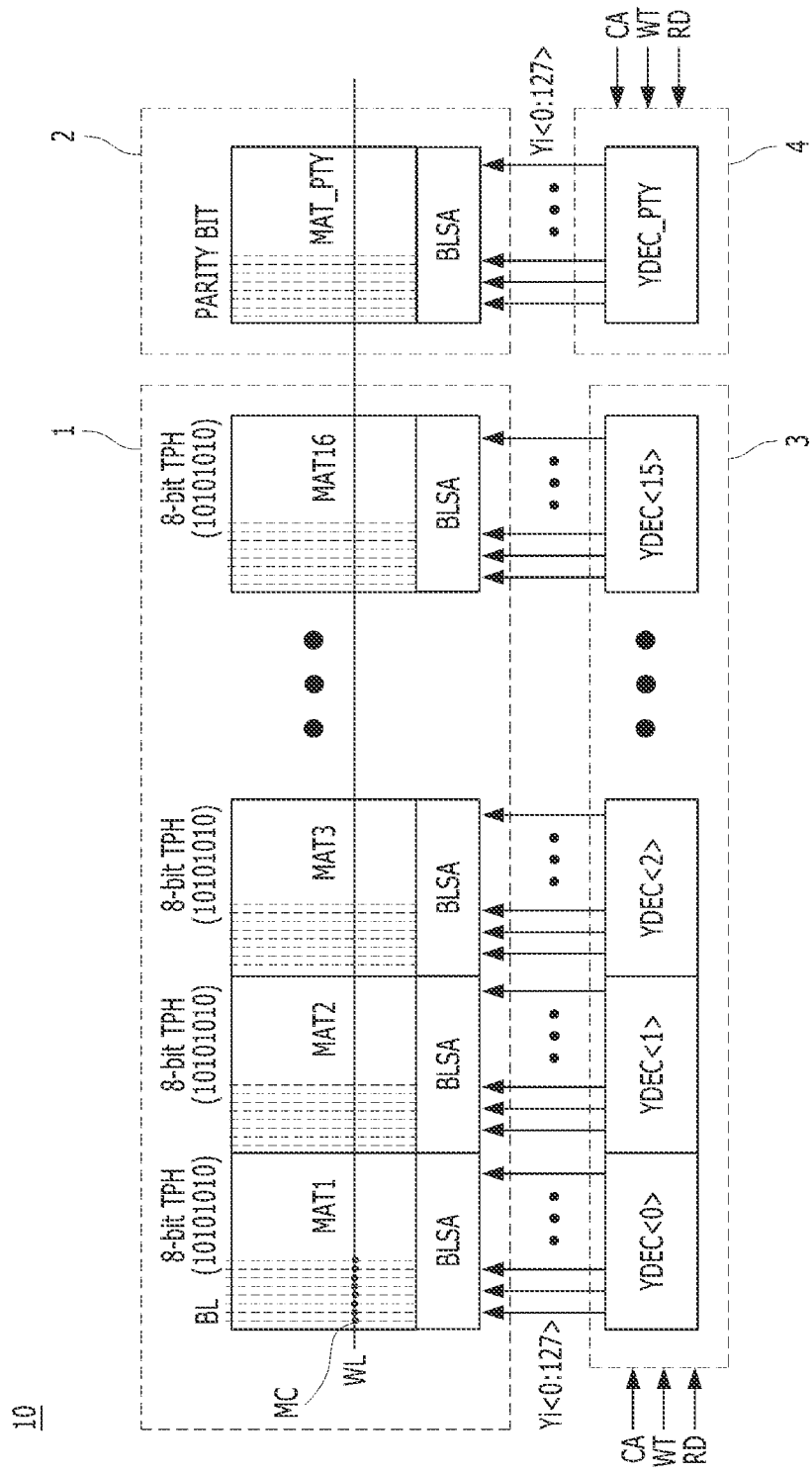
FIG. 1 is a block diagram illustrating a test operation of a memory device employing an on-chip ECC scheme.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like does not necessarily mean only one embodiment, and different references to any such phrase are not necessarily to the same embodiment(s). The term "embodiments" when used herein does not necessarily refer to all embodiments.

With reference to the drawings, a method for reducing the time it takes to perform a test operation in a memory device employing an on-chip ECC scheme is described below. The description below focuses on structure primarily related to a test operation, which may be a test write operation or a test read operation. In general, there are also two types of normal operations of the memory device: a normal write operation and a normal read operation. In some instances, either type of write operation, i.e., normal or test, may be referred to simply as 'a write operation', and the same is true for a normal read operation and a test read operation; in some instances, either may referred to simply as 'a read operation'.

FIG. 1 is a block diagram illustrating a test operation of a memory device employing an on-chip ECC scheme. FIG. 1 mainly shows a column-side structure in one bank of the memory device 10, with the understanding that each of the other banks has the same structure.

Referring to FIG. 1, the memory device 10 may include a normal cell region 1 for storing normal data, and a parity cell region 2 for storing parity bits for correcting error(s) in normal data. For example, a plurality of cell matrices may be disposed in the normal cell region 1, and at least one cell matrix may be disposed in the parity cell region 2. Bit line sense amplifier (BLSA) circuits respectively corresponding to cell matrices may be disposed in the norm& cell region 1 and the parity cell region 2. By way of example, the normal cell region 1 may be formed of 16 cell matrices MAT1 to MAT16, and the parity cell region 2 may be formed of one cell matrix MAT_PTY. The description below is based on this exemplary configuration; however, the present invention is not limited such configuration.

Also, the memory device 10 may include a plurality of normal column decoders 3 and a parity column decoder 4. The normal column decoder 3 may be formed of 16 column decoders YDEC<0:15> which respectively correspond to the 16 cell matrices MAT1 to MAT16, and the parity column decoder 4 may be formed of one column decoder YDEC_PTY corresponding to one cell matrix MAT_PTY.

When a write command WT or a read command RD is activated, the normal column decoders YDEC<0:15> and the parity column decoders YDEC_PTY may decode a column address CA, and activate one among 128 column selection signals Yi<0:127>, Each of the BLSA circuits may sense, amplify, and output data carried on a bit line BL according to the activated column selection signal Yi<x>, where x is an integer between 0 and 127. In this case, a plurality of (e.g., eight) bit lines BL, that is, memory cells MC, may be selected according to one column selection signal Yi<x>.

A parallel test operation of the memory device 10 shown in FIG. 1 is described below.

When a write command WT is input after a test mode is set, a test write operation may be performed. The word line WL of all cell matrices MAT1 to MAT16 and MAT_PTY corresponding to a row address may be activated, and a column selection signal Yi<x> corresponding to a column address CA may be activated. Accordingly, in each cell matrix, eight memory cells MC coupled between the activated word line WL and the bit lines BL selected according to the activated column selection signal Yi<x> may be selected. Herein, since an 8-bit test pattern TPH, for example, '10101010', is written into each of the 16 cell matrices MAT1 to MAT16 of the normal cell region 1, a test pattern of a total of 8*16=128 bits may be written according to one column selection signal Yi<x>. Also, an 8-bit parity bit for correcting an error of a 128-bit test pattern may be written into the cell matrix MAT_PTY of the parity cell region 2.

Subsequently, when a read command RD is input, a test read operation may be performed. The word line WL of all cell matrices MAT1 to MAT16 and MAT_PTY corresponding to a row address may be activated, and the column selection signal Yi<x> corresponding to a column address CA may be activated. Accordingly, in each cell matrix, eight memory cells MC coupled between the activated word line WL and the selected bit lines BL may be selected. The memory device 10 may correct an error of a 128-bit test pattern that is read from the normal cell region 1 based on a parity bit that is read from the parity cell region 2, and compare the error-corrected test pattern with a target test pattern, that is, '10101010', and output a one-bit test result signal indicating a pass/failure (PASS/FAIL). The target test pattern may be preset.

Figure 2:
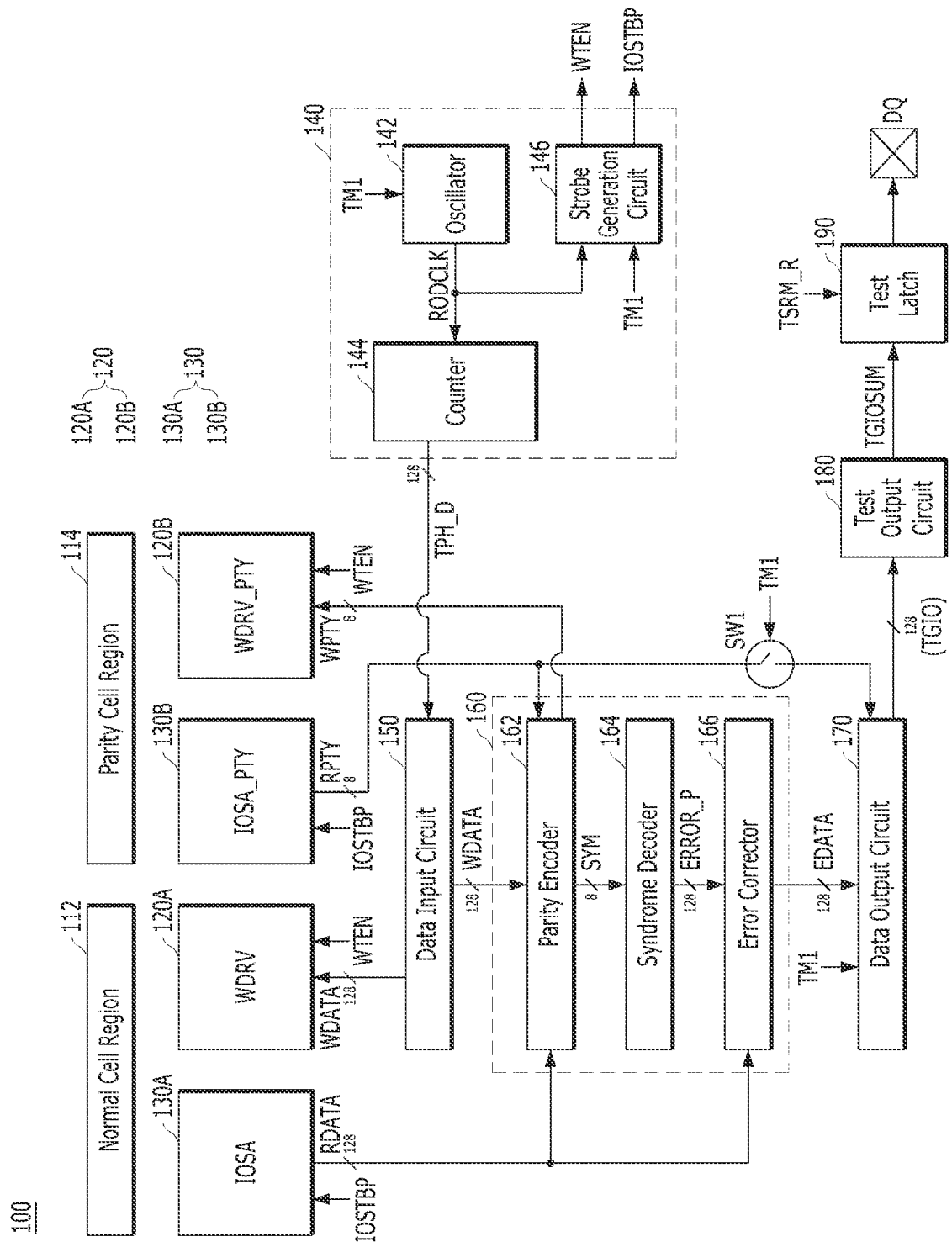
FIG. 2 is a block diagram illustrating a structure of a memory device in accordance with an embodiment of the present invention.

FIG. 2 is a block diagram illustrating a structure of a memory device 100 in accordance with an embodiment of the present invention. FIG. 2 shows the memory device 100 including one bank, and a structure for verifying an encoding operation of an error correction circuit of the bank.

Referring to FIG. 2, the memory device 100 may include a normal cell region 112, a parity cell region 114, a write circuit 120, a read circuit 130, a pattern generation circuit 140, a data input circuit 150, an error correction circuit 160, a data output circuit 170, a test output circuit 180, and a test latch 190.

The normal cell region 112 may store write data WDATA and output read data RDATA. The normal cell region 112 may store normal data and may correspond to the normal cell region 1 of FIG. 1. A case in which 16 cell matrices are provided in the normal cell region 112 and 128-bit write data WDATA and read data RDATA are written and read is described as an example.

The parity cell region 114 may store write parity bits WPTY and output read parity bits RPTY. The parity cell region 114 may store parity bits for correcting an error of normal data, and may correspond to the parity cell region 2 of FIG. 1. A case in which one cell matrix is provided in the parity cell region 114 and 8-bit write parity bits WPTY and read parity bits RPTY are written and read is described below as an example. Bit line sense amplifier (BLSA) circuits (not shown) respectively corresponding to cell matrices may be disposed in the normal cell region 112 and the parity cell region 114.

The write circuit 120 may write the write data WDATA and the write parity bits WPTY into the normal cell region 112 and the parity cell region 114 according to a write enable signal WTEN, respectively, To be specific, the write circuit 120 may include a normal write circuit WDRV 120A and a parity write circuit WDRV_PTY 120B. The normal write circuit 120A may write the write data WDATA transferred from the data input circuit 150 into the normal cell region 112. The normal write circuit 120A may write 128-bit write data WDATA into 16 cell matrices of the normal cell region 112 by 8 bits for each cell matrix, respectively. The parity write circuit 120B may write the write parity bits WPTY generated from the error correction circuit 160 into the parity cell region 114. The normal write circuit 120A and the parity write circuit 120B may be realized as a write driver.

The read circuit 130 may read the read data RDATA and the read parity bits RPTY from the normal cell region 112 and the parity cell region 114 according to a read strobe signal IOSTBP, respectively. The read circuit 130 may include a normal read circuit IOSA 130A and a parity read circuit IOSA_PTY 130B. The normal read circuit 130A may sense/amplify the read data RDATA output from the normal cell region 112. The parity read circuit 130B may sense/amplify the read parity bits RPTY output from the parity cell region 114. The normal read circuit 130A and the parity read circuit 130B may be realized as an I/O sense amplifier.

The pattern generation circuit 140 may generate test data TPH_D whose value is sequentially increased in a first test mode. The test data TPH_D may be formed of the same number of bits (i.e., 128 bits) as the write data WDATA, and may be provided as the write data WDATA to the normal write circuit 120A through the data input circuit 150. To be specific, the pattern generation circuit 140 may include an oscillator 142, a counter 144, and a strobe generation circuit 146.

The oscillator 142 may generate a test clock RODCLK toggling at a set frequency or cycle. The oscillator 142 may be formed of a ring oscillator delay ROD in which a plurality of delay cells are coupled in series to form a ring type. A plurality of delay cells may be coupled to an inverter chain. The oscillator 142 may generate a test clock RODCLK that is activated according to a first test mode signal TM1 indicating an entry into the first test mode and toggles at a set frequency or cycle. According to an embodiment of the present invention, the oscillator 142 may adjust the cycle of the test clock RODCLK by adjusting the number of delay cells.

The counter 144 may generate the test data TPH_D by counting cycles or toggles of the test clock RODCLK. In the first test mode, the counter 144 may generate the 128-bit test data TPH_D by counting cycles or toggles of the test clock RODCLK, and provide the generated test data TPH_D to the data input circuit 150. The counter 144 may generate 128-bit test data TPH_D whose value is sequentially increased by counting cycles or toggles of the test clock RODCLK. The counter 144 may generate the test data TPH_D whose value is increased by +1 each time the test clock RODCLK toggles. For example, the counter 144 may generate the test data TPH_D having a decimal value of "11" from "10" when the test clock RODCLK toggles.

When the first test mode signal TM1 is activated, the strobe generation circuit 146 may generate a write enable signal WTEN notifying a test write operation according to the test clock RODCLK, and then generate a read strobe signal IOSTBP notifying a test read operation. In an embodiment of the present invention, the first test mode signal TM1 may include a test write signal TM1_W (not shown) indicating a write operation and a test read signal TM1_R (not shown) indicating a read operation in the first test mode. For example, the first test mode signal TM1 may be formed of a 2-bit signal, and the Most Signal Bit (MSB) may correspond to the test write signal TM1 and the Least Signal Bit (LSB) may correspond to the test read signal TM1_R. When the test write signal TM1_W is activated, the strobe generation circuit 146 may activate the write strobe signal WTEN whenever the test clock RODCLK toggles, and when the test read signal TM1_R is activated, the strobe generation circuit 146 may activate the read strobe signal IOSTBP whenever the test clock RODCLK toggles.

The data input circuit 150 may receive the test data TPH_D provided from the pattern generation circuit 140 as write data WDATA in the first test mode. The data input circuit 150 may provide the test data TPH_D to the normal write circuit 120A and the error correction circuit 160. Preferably, the data input circuit 150 may be realized as a repeater. Although not illustrated in the drawing, during a normal write operation, the data input circuit 150 may receive and buffer data input to the global data line GIO through data pads DQ to be transferred as write data WDATA to the write circuit 120A.

The error correction circuit 160 may generate write parity bits WPTY based on the write data WDATA, and correct an error of the read data RDATA based on the read parity bits RPTY so as to output error-corrected data EDATA. To be specific, the error correction circuit 160 may include a parity encoder 162, a syndrome decoder 164, and an error corrector 166.

During a write operation, the parity encoder 162 may receive the write data WDATA transferred from the data input circuit 150 and output write parity bits WPTY. The write parity bits WPTY may be data for correcting an error of the write data WDATA, and may be generated according to a predefined error correction technique. Here, 8-bit write parity bits WPTY may be generated for 128-bit write data WDATA. Also, during a read operation, the parity encoder 162 may generate a syndrome SYM using read data RDATA and read parity bits RPTY. The parity encoder 162 may generate parity bits based on the read data RDATA according to the predefined error correction technique, and compares the generated parity bits and read parity bits RPTY with each other to generate an 8-bit syndrome SYM, which represents positions) or error(s) of the read data RDATA. The parity encoder 162 may be an encoding circuit of the error correction circuit 160.

The syndrome decoder 164 may detect an error position of the read data RDATA based on the syndrome SYM. The syndrome decoder 164 may decode the syndrome SYM to generate a 128-bit error flag ERR_P indicating error position information of the read data RDATA. Each bit of the error flag ERR_P may indicate whether a corresponding bit of the read data RDATA is an error. The syndrome decoder 164 may be a decoding circuit of the error correction circuit 160.

The error corrector 166 may correct an error of the 128-bit read data RDATA based on the error flag ERR_P and a predefined error correction technique and output 128-bit error-corrected data EDATA.

Herein, during a write operation, an operation that the parity encoder 162 receives the write data WDATA and outputs the write parity bits WPTY may be an encoding operation. On the other hand, during a read operation, a decoding operation may include an operation that the parity encoder 162 generates a syndrome SYM based on the read data RDATA and the read parity bits RPTY, an operation that the syndrome decoder 164 detects an error position of the read data RDATA based on the syndrome SYM, and an operation that the error corrector 166 corrects an error of the read data RDATA based on the error flag ERR_P so as to generate the error-corrected data EDATA. The first test mode may be a mode for testing the encoding operation of the error correction circuit 160.

The memory device 100 may further include a first coupling circuit SW1 for transferring the read parity bits RPTY output from the parity read circuit 130B to the data output circuit 170 in the first test mode. The first coupling circuit SW1 may be activated based on the test read signal TM1_R of the first test mode signal TM1, and may transfer the 8-bit read parity bits RPTY to the data output circuit 170.

The data output circuit 170 may buffer the error-corrected data EDATA and output the buffered data to a test data line TGIO. According to an embodiment of the present invention, in the first test mode, the data output circuit 170 may mask the error-corrected data EDATA and map 8-bit read parity bits RPTY transferred from the first coupling circuit SW1 to some lines among 128 test data lines TGIO. In other words, when the first test mode signal TM1 is deactivated, the data output circuit 170 may buffer the error-corrected data EDATA and output the buffered data to the test data lines TGIO, and when the test read signal TM1_R of the first test mode signal TM1 is activated, the data output circuit 170 may map and output the 8-bit read parity bits RPTY to some lines among the 128 test data lines TGIO. Preferably, the data output circuit 170 may be realized as a repeater. Although not illustrated in the drawing, during a normal read operation, the data output circuit 170 may buffer the error-corrected data EDATA and output the buffered data to the global data line GIO.

The test output circuit 180 may compress data transferred to the test data line TGIO and output the compressed data TGIOSUM. In other words, the test output circuit 180 may generate the compressed data TGIOSUM by compressing the read parity bits RPTY in the first test mode, and in other modes, compress the error-corrected data EDATA and output the compressed data TGIOSUM. For example, the test output circuit 180 may compare each bit of the read parity bits RPTY with each bit of the target test pattern to compress a comparison result, and output one-bit compressed data TGIOSUM indicating a pass/failure in the first test mode. In this case, the target test pattern may be parity bits to be normally generated based on the sequentially increasing test data TPH_D. On the other hand, the test output circuit 180 may compare each bit of the error-corrected data EDATA with each bit of a test pattern to compress the comparison result in a mode other than the first test mode, and output one-bit compressed data TGIOSUM indicating a pass/failure. According to an embodiment of the present invention, the test output circuit 180 may receive the first test mode signal TM1, select one among the target test pattern and the test pattern, and compare data transferred to the test data line TGIO with the selected test pattern.

The data output circuit 170 and the test output circuit 180 may be an output circuit. In other words, the output circuit may compress the read parity bits RPTY output from the parity cell region 114 in the first test mode and output the compressed data TGIOSUM.

The test latch 190 may latch the compressed data TGIOSUM and output the latched data to one data pad among the data pads DQ according to the test output signal TSRM_R.

Although not illustrated in FIG. 2, the data input circuit 150, the parity encoder 162, the normal write circuit 120A, and the parity write circuit 1203 may be activated during a write operation. For example, the data input circuit 150, the parity encoder 162, the normal write circuit 120A, and the parity write circuit 120B may be activated according to the write command WT. On the other hand, the normal read circuit 130A, the parity read circuit 130B, the parity encoder 162, the syndrome decoder 164, the error corrector 166, and the data output circuit 170 may be activated during a read operation. For example, the normal read circuit 130A, the parity read circuit 1303, the parity encoder 162, the syndrome decoder 164, the error corrector 166, and the data output circuit 170 may be activated according to a read command RD. The test output circuit 180 and the test latch 190 may be activated during a test read operation.

A test operation for verifying the encoding operation of the error correction circuit 160 of FIG. 2 is described below with reference to FIGS. 3 to 5.

Figure 3:
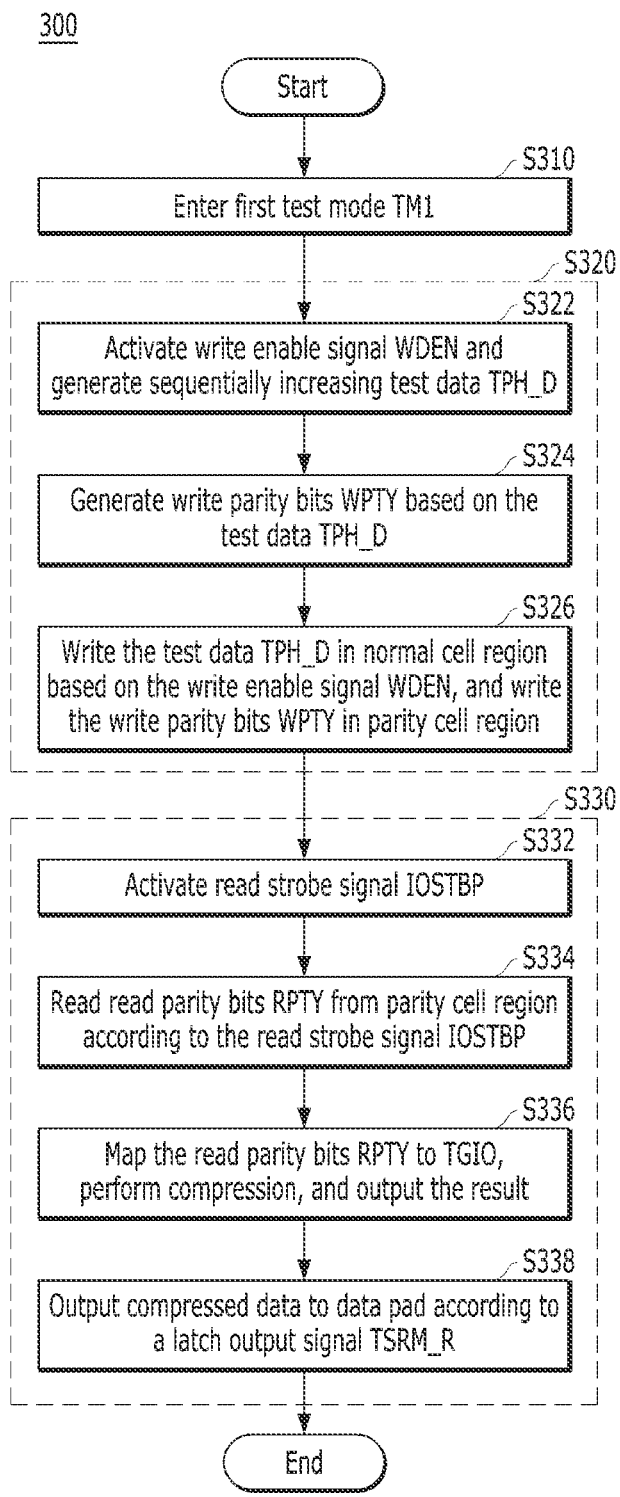
FIG. 3 is a flowchart illustrating a test operation in a first test mode of a memory device, such as that shown in FIG. 2.

FIG. 3 is a flowchart describing a test operation 300 in the first test mode of the memory device 100 shown in FIG. 2. FIG. 4 is a timing diagram illustrating a test write operation S320 of FIG. 3, and FIG. 5 is a timing diagram illustrating a test read operation S330 of FIG. 3.

Referring to FIG. 3, a first test mode signal TM1 indicating an entry into the first test mode may be activated in operation S310. The first test mode signal TM1 may include a test write signal TM1_W indicating a write operation and a test read signal TM1_R indicating a read operation in the first test mode.

First, when the first test mode signal TM1 corresponding to the test write signal TM1_W is activated, a test write operation may be performed in operation S320.

Figure 4:
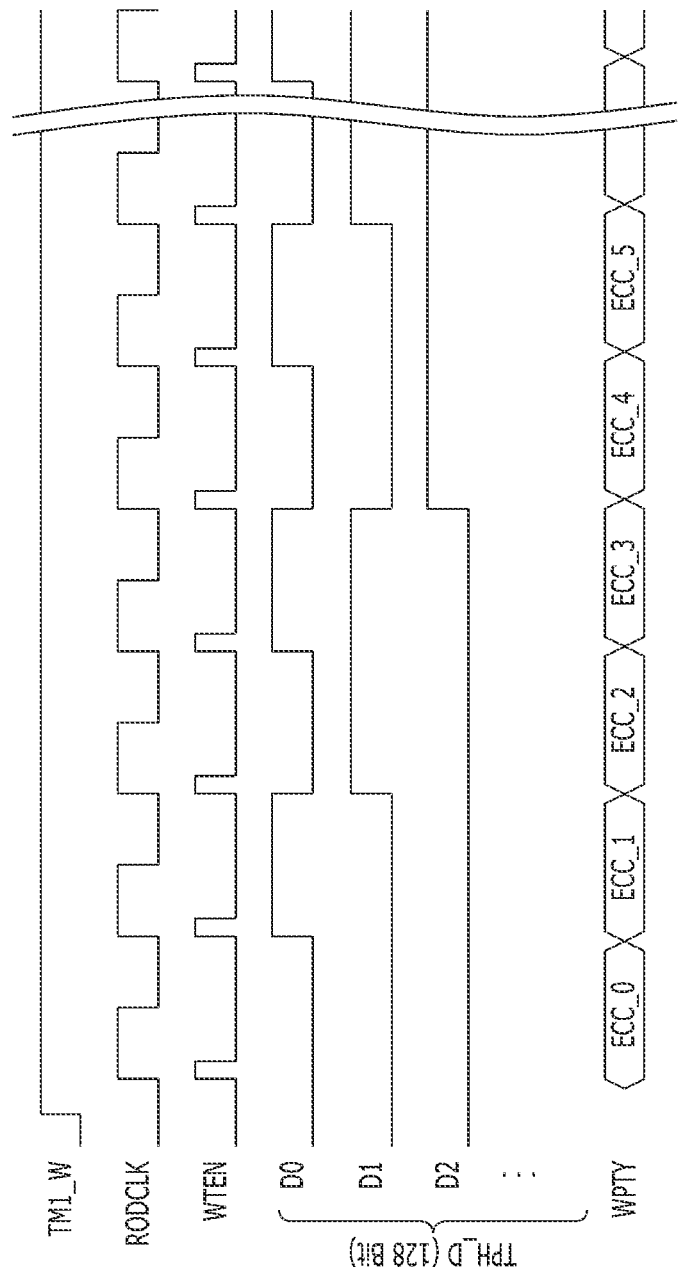
FIGS. 4 and 5 are timing diagrams to help understand a test operation, such as that of FIG. 3.

Referring to FIG. 4, the oscillator 142 of the pattern generation circuit 140 may generate a test clock RODCLK that toggles at a set frequency or cycle. The counter 144 may count cycles of a test clock RODCLK so as to generate sequentially increasing 128-bit test data TPH_D, and the strobe generation circuit 146 may activate a write enable signal WTEN notifying the test write operation each time the test clock RODCLK toggles in operation S322.

The data input circuit 150 may receive the test data TPH_D provided from the pattern generation circuit 140 in the first test mode as write data WDATA, and transfer the received test data TPH_D to the normal write circuit 120A and the parity encoder 162. The parity encoder 162 may receive the write data WDATA transferred from the data input circuit 150 and generate write parity bits WPTY in operation S324.

The write circuit 120 may write the write data WDATA and the write parity bits WPTY into the normal cell region 112 and the parity cell region 114 based on the write enable signal WTEN in operation S326. The normal write circuit 120A may write the 128-bit write data WDATA into 16 cell matrices of the normal cell region 112 by 8 bits for each cell matrix, respectively, and the parity write circuit 120B may write the write parity bits WPTY generated in the parity encoder 162 into the parity cell region 114.

Subsequently, when the first test mode signal TM1 corresponding to the test read signal TM1_R is activated, a test read operation may be performed in operation S330.

Figure 5:
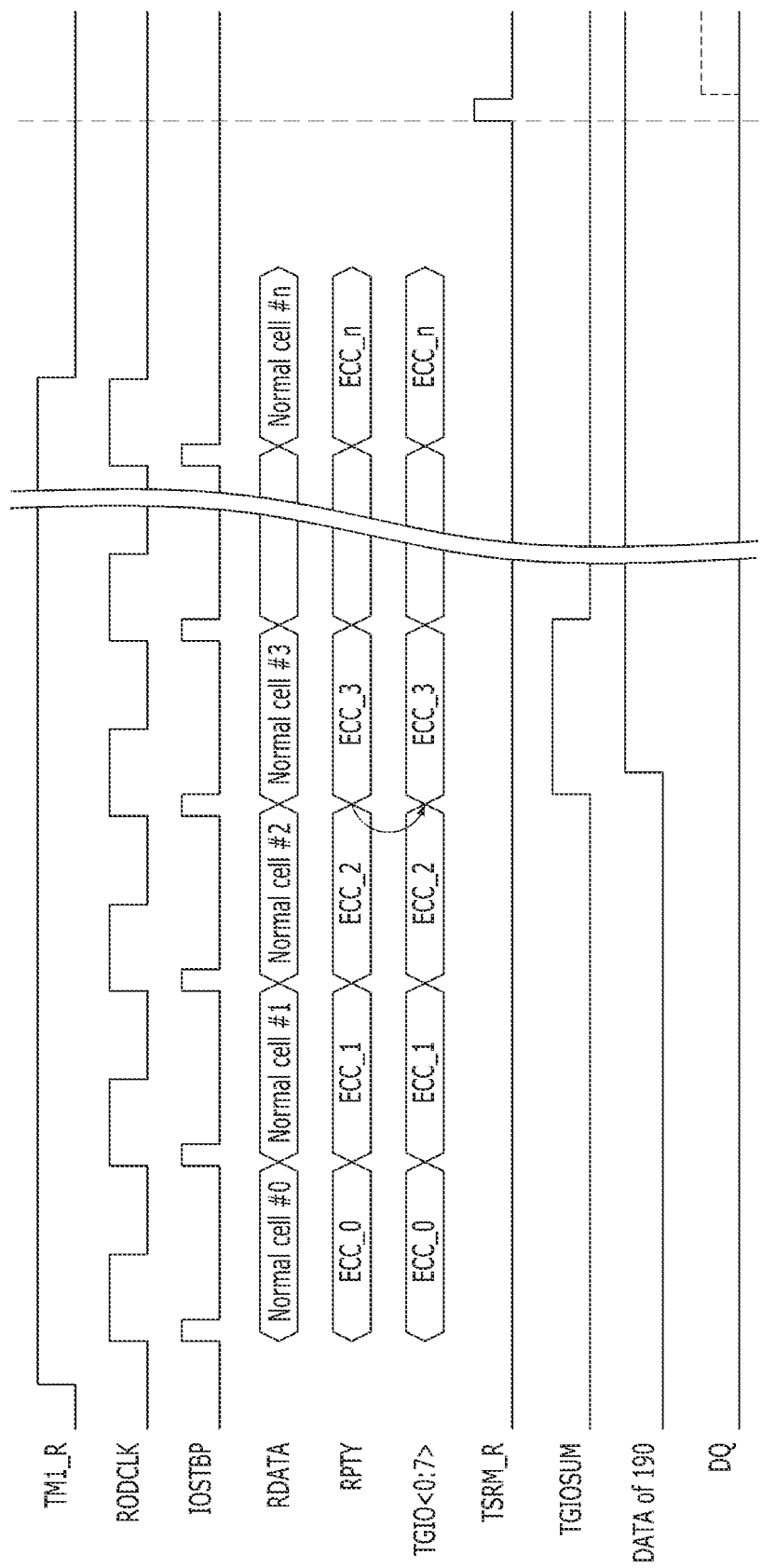

Referring to FIG. 5, the oscillator 142 of the pattern generation circuit 140 may generate a test clock RODCLK that toggles at a set frequency or cycle. The strobe generation circuit 146 may activate the read strobe signal IOSTBP indicating a test read operation whenever the test clock RODCLK toggles in operation S332.

The read circuit 130 may read out read data RDATA and read parity bits RPTY from the normal cell region 112 and the parity cell region 114 respectively according to the read strobe signal IOSTBP in the operation S334. The normal read circuit 130A may sense/amplify the read data RDATA output from the normal cell region 112, and the parity read circuit 130B may sense/amplify the read parity bits RPTY output from the parity cell region 114.

In this case, the first coupling circuit SW1 may be activated according to the first test mode signal TM1 and transfer 8-bit read parity bits RPTY to the data output circuit 170. The data output circuit 170 may map and output the 8-bit read parity bits RPTY to some lines among the 128 test data lines TGIO (e.g., lower 8 lines TGIO<0:7>). The test output circuit 180 may compare the read parity bits RPTY delivered to the test data lines TGIO with the target test pattern to compress a comparison result, and output one-bit compressed data TGIOSUM indicating a pass/failure in operation S336. The test latch 190 may latch the compressed data TGIOSUM and output the latched data to a data pad DQ according to the test output signal TSRM_R in operation S338.

For example, as illustrated in FIG. 5, when the read parity bits RPTY "ECC_3" read from the parity cell region 114 according to the fourth activated read strobe signal IOSTBP are different from the target test pattern, the test output circuit 180 may output compressed data TGIOSUM of a logic high level in order to indicate compression failure FAIL. When the compressed data TGIOSUM reaches a logic high level at least once, the test latch 190 may latch the value and then output the latched data to the data pad DQ according to the test output signal TSRM_R. The external controller or the test device may determine that there is a defect in the encoding operation of the error correction circuit 160 of the corresponding bank according to the logic high level signal.

On the other hand, when all the read parity bits RPTY read from the parity cell region 114 according to the read strobe signal IOSTBP are the same as the target test pattern, the test output circuit 180 may generate compressed data TGIOSUM that maintains a logic low level. In this case, the test latch 190 may output a logic low level signal through the data pad DQ, and an external controller or the test device may determine that the encoding operation of the error correction circuit 160 of the bank operates normally according to the logic low level signal.

As described above, according to an embodiment of the present invention, in the memory device employing an on-chip ECC scheme, a test may be performed at a speed (e.g., high or low) independent of the speed of an external clock by detecting a defect that may occur in the error correction circuit based on an internally generated clock.

Figure 6:
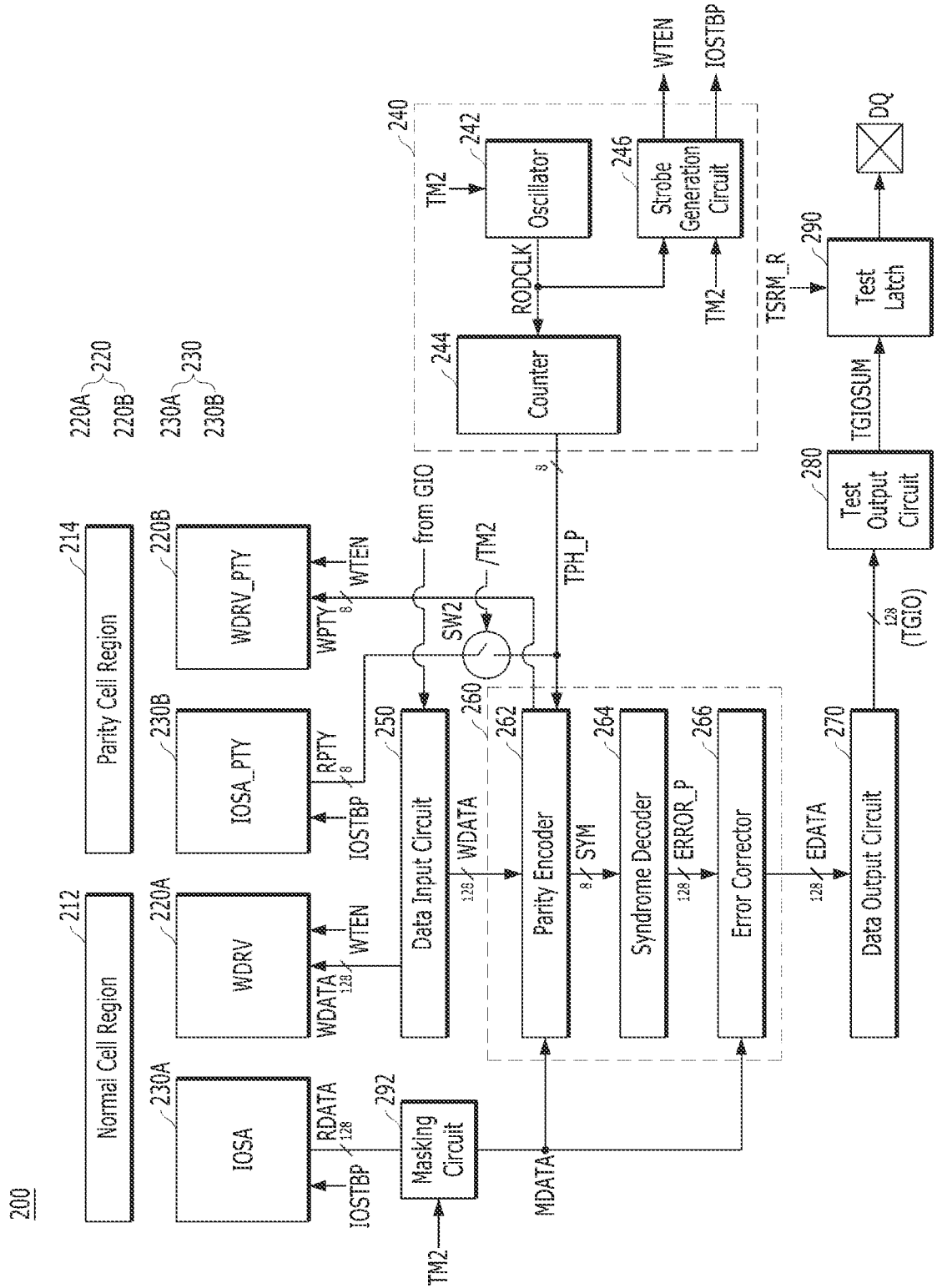
FIG. 6 is a block diagram illustrating a structure of a memory device in accordance with an embodiment of the present invention.

FIG. 6 is a block diagram illustrating a structure of a memory device 200 in accordance with an embodiment of the present invention. FIG. 6 illustrates the memory device 200 including one bank and illustrates a structure for verifying a decoding operation of an error correction circuit of a bank.

Referring to FIG. 6, the memory device 200 may include a normal cell region 212, a parity cell region 214, a write circuit 220, a read circuit 230, a pattern generation circuit 240, and a data input circuit 250, an error correction circuit 260, a data output circuit 270, a test output circuit 280, and a test latch 290. The normal cell region 212, the parity cell region 214, the write circuit 220, the read circuit 230, the test output circuit 280, and the test latch 290 of FIG. 6 are substantially the same as the respective constituent elements of the memory device 100 shown in FIG. 2, detailed description of them is omitted here.

The pattern generation circuit 240 may generate test data TPH_P whose value is sequentially increased in a second test mode. The pattern generation circuit 240 may include an oscillator 242, a counter 244, and a strobe generation circuit 246. The pattern generation circuit 240 may have substantially the same constituent elements as the pattern generation circuit 140 of FIG. 2 except that it is activated according to a second test mode signal TM2 indicating an entry into the second test mode. However, unlike the pattern generation circuit 140 of FIG. 2, the test data TPH_P generated in the pattern generation circuit 240 may be formed of the same number of bits (i.e., 8 bits) as the read parity bits RPTY. Thus, the test data TPH_P as the read parity bits RPTY may be provided to the error correction circuit 260.

The data input circuit 250 may receive data input to a global data line GIO through data pads. The data input circuit 250 may have substantially the same structure as the data input circuit 150 of FIG. 2.

The error correction circuit 260 may generate write parity bits WPTY based on write data WDATA, correct an error of read data RDATA based on the read parity bits RPTY, and output error-corrected data EDATA. To be specific, the error correction circuit 260 may include a parity encoder 262, a syndrome decoder 264, and an error corrector 266. The error correction circuit 260 may have substantially the same structure as the error correction circuit 160 of FIG. 2.

The data output circuit 270 may buffer the error-corrected data EDATA and output the buffered data to a test data line TGIO. Although not illustrated in the drawing, during a normal read operation, the data output circuit 270 may buffer the error-corrected data EDATA and output the buffered data to a global data line GIO.

The memory device 200 may further include a masking circuit 292 for masking the read data RDATA output from the normal cell region 212 through a normal read circuit 230A in a second test mode. When a second test mode signal TM2 is activated, the masking circuit 292 may mask the read data RDATA output from the normal cell region 212 and output all-zero or all-high data as masked data MDATA. On the other hand, when the second test mode signal TM2 is deactivated, the masking circuit 292 may output the read data RDATA output from the normal cell region 212 as masked data MDATA. The masked data MDATA may be provided to the parity encoder 262 and the error corrector 264 of the error correction circuit 260.

Also, the memory device 200 may further include a second coupling circuit SW2 that controls the read parity bits RPTY output from the parity read circuit 230B not to be transferred to the parity encoder 262 in the second test mode. According to an inversion signal /TM2 of the second test mode signal TM2, the second coupling circuit SW2 may be activated and transfer 8-bit read parity bits RPTY from the parity read circuit 230B to the parity encoder 262. In other words, when the second test mode signal TM2 is deactivated, the second coupling circuit SW2 may transfer 8-bit read parity bits RPTY from the parity read circuit 230B to the parity encoder 262. On the other hand, when the second test mode signal TM2 is activated, the second coupling circuit SW2 may perform masking so that the 8-bit read parity bits RPTY are not transferred from the parity read circuit 230B to the parity encoder 262.

During a read operation, the parity encoder 262 may generate a syndrome SYM based on the masked data MDATA and the 8-bit test data TPH_P as the read parity bits RPTY. The parity encoder 262 may generate parity bits based on the masked data MDATA according to a predefined error correction technique, compare the generated parity bits with the 8-bit test data TPH_P as the read parity bits RPTY, and generate an 8-bit syndrome SYM, which represents position(s) of error(s) in masked data MDATA. The syndrome decoder 264 may detect the error position of the masked data MDATA based on the syndrome SYM, and the error corrector 266 may correct the error of the masked data MDATA based on an error flag ERR_P, and output error-corrected data EDATA. The second test mode may be a mode for testing this decoding operation of the error correction circuit 260.

A test operation for verifying the decoding operation of the error correction circuit 260 shown in FIG. 6 is described below with reference to FIGS. 7 and 8.

Figure 7:
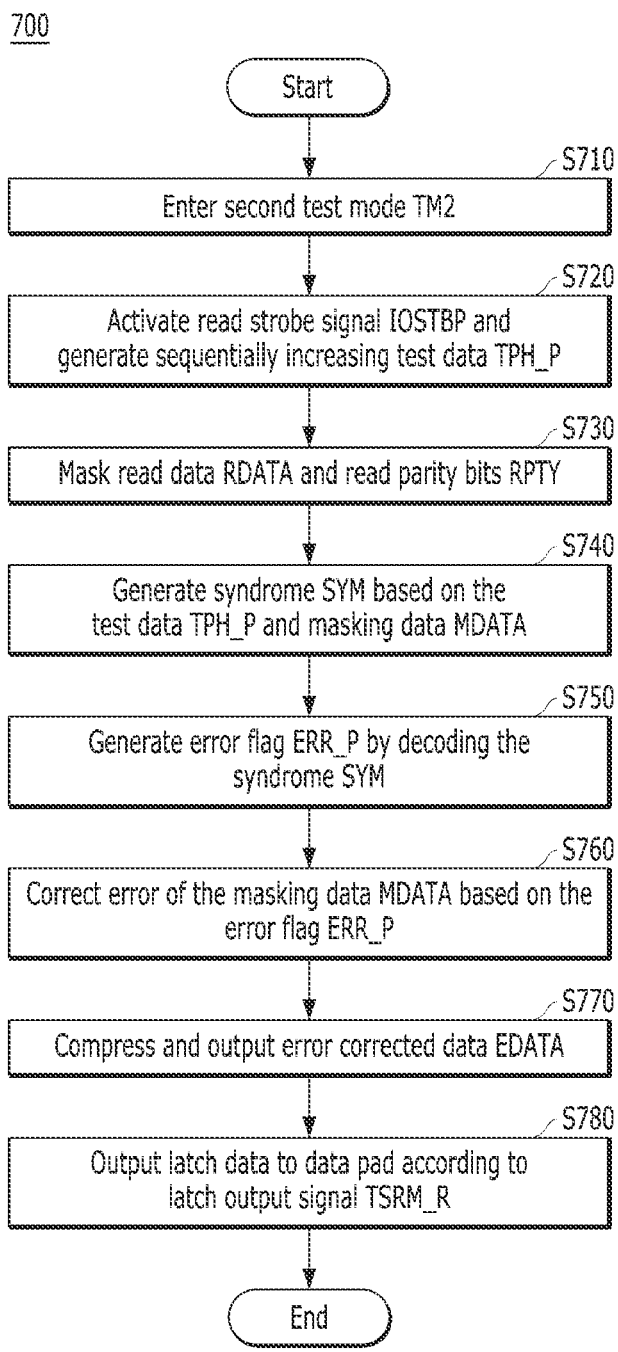
FIG. 7 is a flowchart illustrating a test operation in a second test mode of a memory device, such as that shown in FIG. 6.

FIG. 7 is a flowchart describing a test operation 700 in a second test mode of the memory device 200 shown in FIG. 6. FIG. 8 is a timing diagram to help understand the test operation of FIG. 7.

Referring to FIG. 7, a second test mode signal TM2 indicating an entry into the second test mode may be activated in operation S710. According to an embodiment of the present invention, the second test mode signal TM2 may be activated to perform a test read operation. However, the present invention is not limited thereto, and according to another embodiment, when the second test mode signal TM2 is activated to perform a test write operation, the strobe generation circuit 246 of the pattern generation circuit 240 may activate a write enable signal WTEN, whenever the test clock RODCLK toggles, and the write circuit 220 may write write data WDATA and write parity bits WPTY input through a global data line GIO into the normal cell region 212 and the parity cell region 214, respectively.

Figure 8:
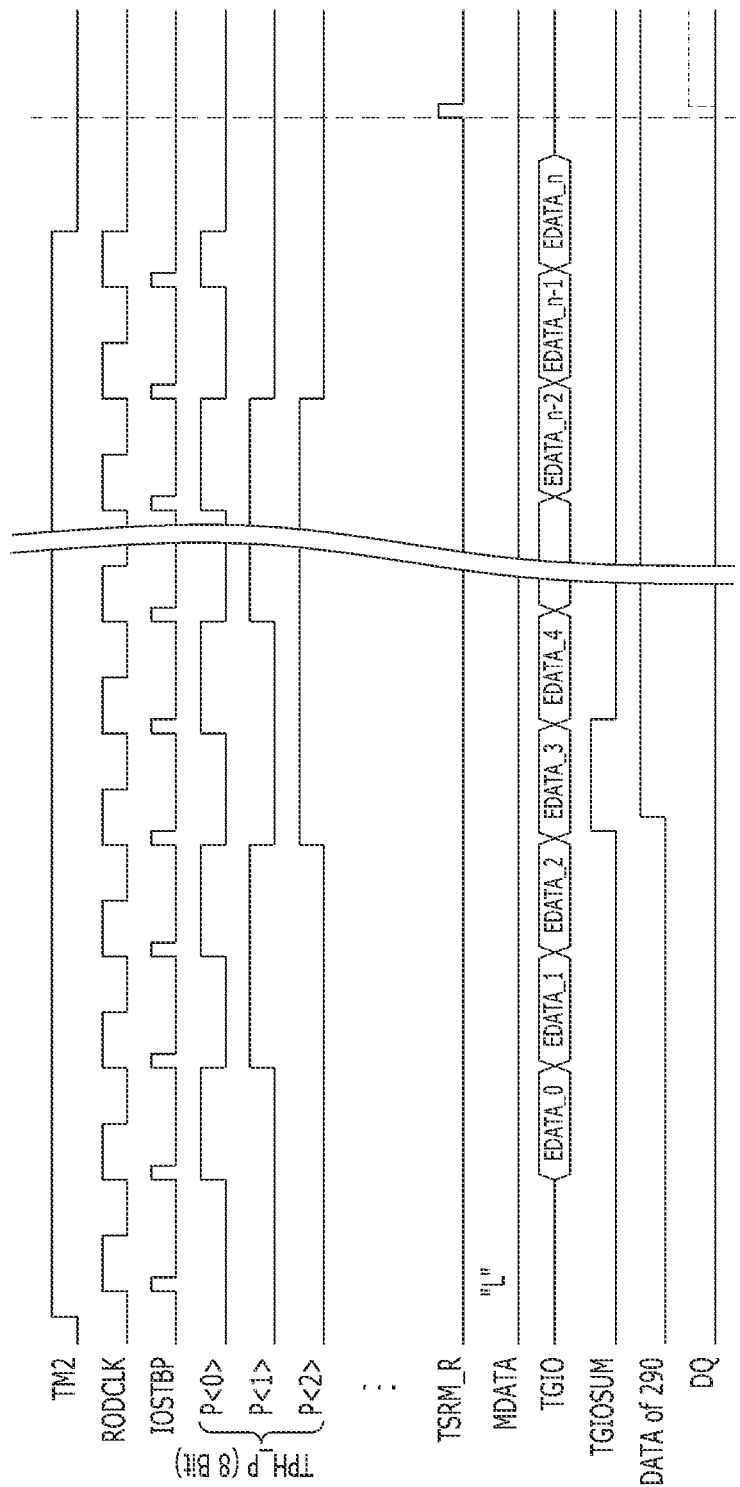
FIG. 8 is a timing diagram to help understand a test operation, such as that of FIG. 7.

Referring to FIG. 8, when the second test mode signal TM2 is activated for a test read operation, the oscillator 242 of the pattern generation circuit 240 may generate a test clock RODCLK that toggles at a set frequency or cycle. The counter 244 may generate 8-bit test data TPH_P whose value is sequentially increased by counting cycles or toggles of the test clock RODCLK in operation S720. The strobe generation circuit 246 may activate a read strobe signal IOSTBP indicating a test read operation whenever the test clock RODCLK toggles. The test data TPH_P may be provided to the parity encoder 262 as read parity bits RPTY.

Herein, the masking circuit 292 may be activated according to the second test mode signal TM2, mask the read data RDATA, and output all-zero or all-high data as masked data MDATA. The second coupling circuit SW2 may perform masking so that the read parity bits RPTY are not transferred from the parity read circuit 230B to the parity encoder 270 in operation S730.

The parity encoder 262 may generate a syndrome SYM based on the masked data MDATA and the test data TPH_P in operation S740. In other words, the parity encoder 262 may generate parity bits based on the masked data MDATA, compare the generated parity bits with the 8-bit test data TPH_P as the parity bits RPTY, and generate an 8-bit syndrome SYM, which represents position(s) of error(s) in the masked data MDATA. The syndrome decoder 264 may decode the syndrome SYM so as to generate a 128-bit error flag ERR_P indicating error position information of the masked data MDATA in operation S750. The error corrector 266 may correct an error of the 128-bit read data RDATA based on the error flag ERR_P according to the predefined error correction technique so as to output the 128-bit error-corrected data EDATA in operation S760.

The data output circuit 270 may buffer the error-corrected data EDATA to output the buffered data to a test data line TGIO, and the test output circuit 280 may compare the error-corrected data EDATA with a test pattern to compress a comparison result, and output a one-bit compressed data TGIOSUM indicating a pass/failure in operation S770. The test latch 290 may latch the compressed data TGIOSUM and output the latched data to a data pad according to a test output signal TSRM_R in operation S780.

For example, as illustrated in FIG. 8, the error-corrected data EDATA may be output based on the test data TPH_P of "00000100" which is generated during the fifth cycle of the test clock RODCLK and the masked data MDATA, which is all-zero or all-high data. When the error-corrected data EDATA is different from the test pattern, the test output circuit 280 may output compressed data TGIOSUM of a logic high level to indicate failure FAIL. In this case, the test pattern may be normally error-corrected data that are obtained based on the sequentially increasing parity bits and all-zero or all-high data. The test pattern may be all-zero or all-high data. The test latch 290 may latch a value when the compressed data TGIOSUM reaches a logic high level at least once, and then output the latched data to a data pad DQ according to the test output signal TSRM_R. An external controller or the test device may determine that there is a defect in the decoding operation of the error correction circuit 260 of the corresponding bank based on the logic high level signal. On the other hand, when the error-corrected data EDATA is the same as the test pattern, the test output circuit 280 may output compressed data TGIOSUM maintaining a logic low level. In this case, the test latch 290 may output a logic low level signal through the data pad DQ, and the external controller or the test device may determine that the decoding operation of the error correction circuit 260 of the corresponding bank is operating normally based on the logic low level signal.

As described above, according to an embodiment of the present invention, only a failure caused by a defect of the error correction circuit 260 may be detected regardless of a failure caused by a cell defect (e.g., refresh, short-circuit, etc.) by using all-zero or all-high data instead of read data RDATA that is output from the normal cell region in order to verify the decoding operation of the error correction circuit 260.

Figure 9:
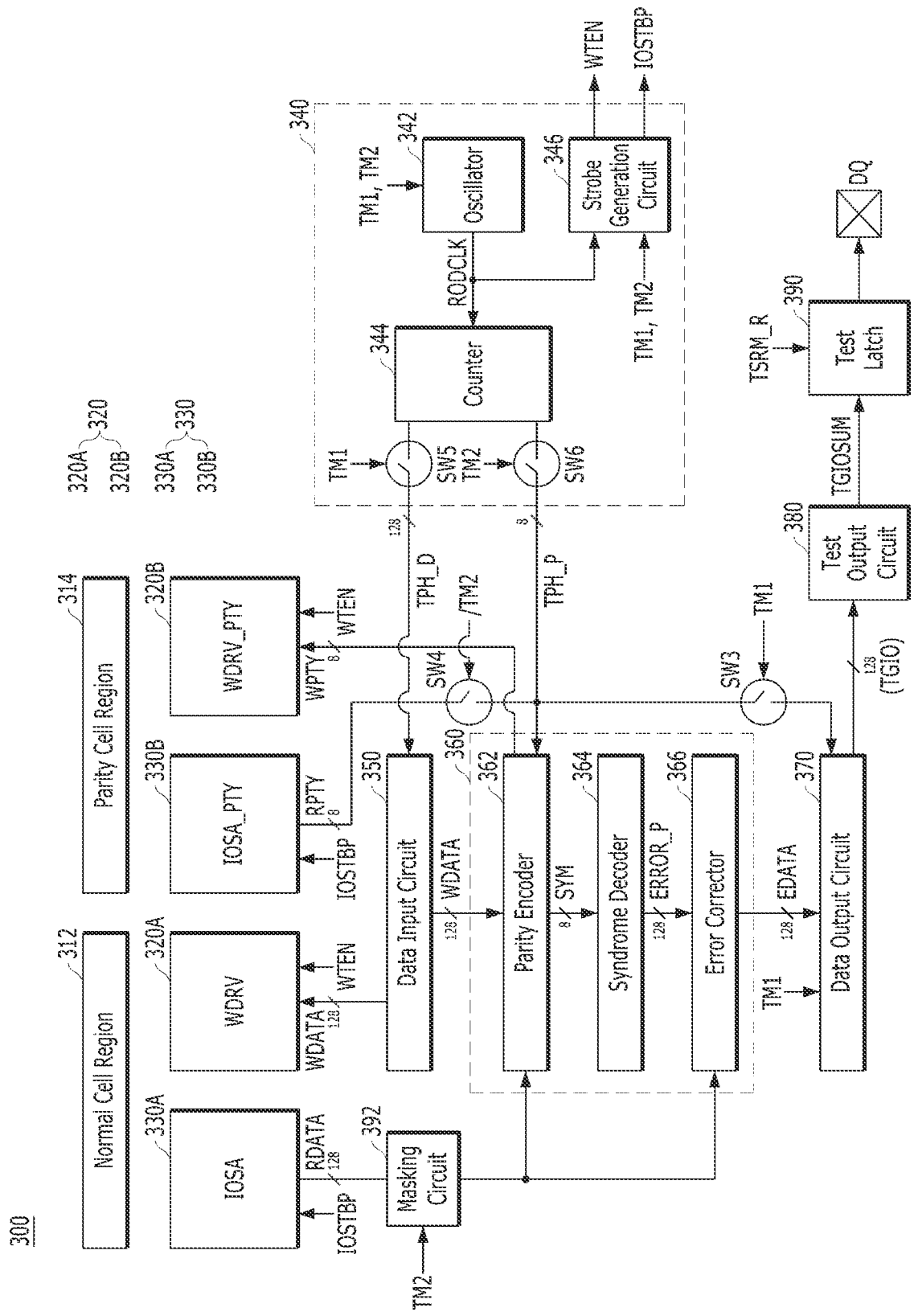
FIG. 9 is a block diagram illustrating a structure of a memory device in accordance with an embodiment of the present invention.

FIG. 9 is a block diagram illustrating a structure of a memory device 300 in accordance with an embodiment of the present invention. In FIG. 9, the memory device 300 including one bank is shown, and a structure for verifying both an encoding operation and a decoding operation of the error correction circuit of the bank is illustrated.

Referring to FIG. 9, the memory device 300 may include a normal cell region 312, a parity cell region 314, a write circuit 320, a read circuit 330, a pattern generation circuit 340, and a data input circuit 350, an error correction circuit 360, a data output circuit 370, a test output circuit 380, and a test latch 390. The error correction circuit 360 may include a parity encoder 362, a syndrome decoder 364, and an error corrector 366. Also, the memory device 300 may further include a first coupling circuit SW3 as a structure for verifying the encoding operation described in FIG. 2, and it may further include a masking circuit 392 and a second coupling circuit SW4 as a structure for verifying the decoding operation described in FIG. 6.

Since the normal cell region 312, the parity cell region 314, the write circuit 320, the read circuit 330, the data input circuit 350, the error correction circuit 360, the data output circuit 370, the test output circuit 380, the test latch 390, and the first coupling circuit SW3 shown in FIG. 9 are substantially the same as the respective constituent elements of the memory device 100 of FIG. 2, detailed description of them is omitted here. Since the masking circuit 392 and the second coupling circuit SW4 of FIG. 9 are substantially the same as those of the memory device 200 of FIG. 6, detailed description of them is omitted here.

The pattern generation circuit 340 may generate test data TPH_D whose value is sequentially increased in a first test mode and may generate test data TPH_P whose value is sequentially increased in a second test mode. In the first test mode, the test data TPH_D may be formed of the same number of bits (i.e., 128 bits) as write data WDATA, and may be provided as write data WDATA to the normal write circuit 320A through the data input circuit 350. In the second test mode, the test data TPH_P may be formed of the same number of bits (i.e., 8 bits) as read parity bits RPTY, and may be provided as read parity RPTY to the parity encoder 362 of the error correction circuit 360.

To be specific, the pattern generation circuit 340 may include an oscillator 342, a counter 344, a strobe generation circuit 346, a third coupling circuit SW5, and a fourth coupling circuit SW6.

When a first test mode signal TM1 or a second test mode signal TM2 is activated, the oscillator 342 may generate a test clock RODCLK that toggles at a set frequency or cycle. The counter 344 may generate test data TPH_D and test data TPH_P by counting cycles or toggles of the test clock RODCLK.

The counter 344 may generate 128-bit test data TPH_D and 8-bit test data TPH_P by counting cycles or toggles of the test clock RODCLK. According to an embodiment of the present invention, the counter 344 may receive the first test mode signal TM1 and the second test mode signal TM2 and selectively generate test data corresponding to the corresponding test mode.

The third coupling circuit SW5 may provide the data input circuit 350 with the test data TPH_D generated in the counter 344 according to the first test mode signal TM1. The fourth coupling circuit SW6 may provide the parity encoder 362 of the error correction circuit 360 with the test data TPH_P generated in the counter 344 according to the second test mode signal TM2.

When the first test mode signal TM1 or the second test mode signal TM2 is activated, the strobe generation circuit 346 may generate a write enable signal WTEN indicating a test write operation according to the test clock RODCLK and then generate a read strobe signal IOSTBP indicating a test read operation.

A test operation of the memory device 300 of FIG. 9 is described below with reference to FIGS. 10A to 11.

Figure 10A:
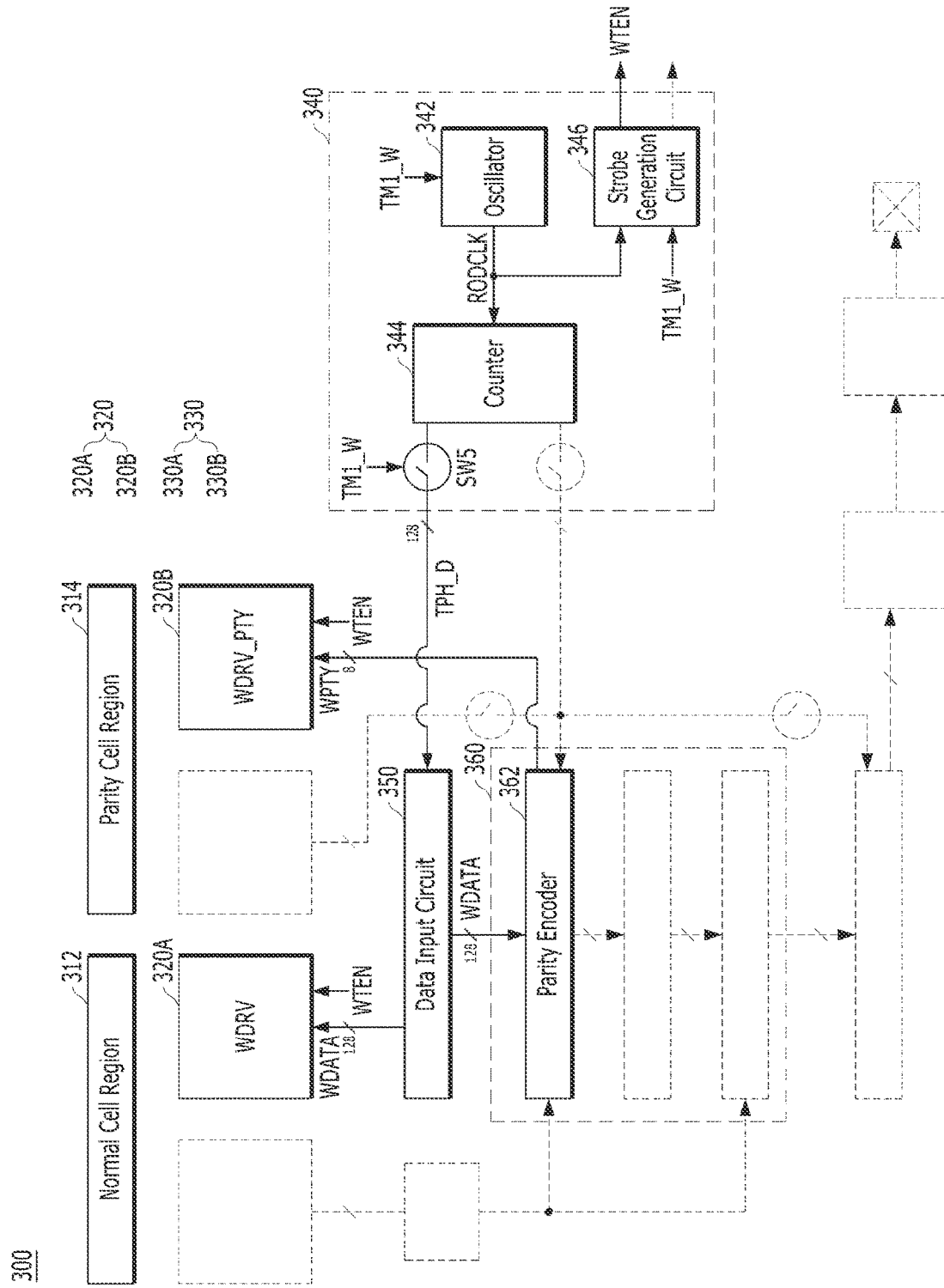
FIGS. 10A and 10B are block diagrams illustrating a test operation for verifying an encoding operation of an error correction circuit, such as that shown in FIG. 9.
Figure 10B:
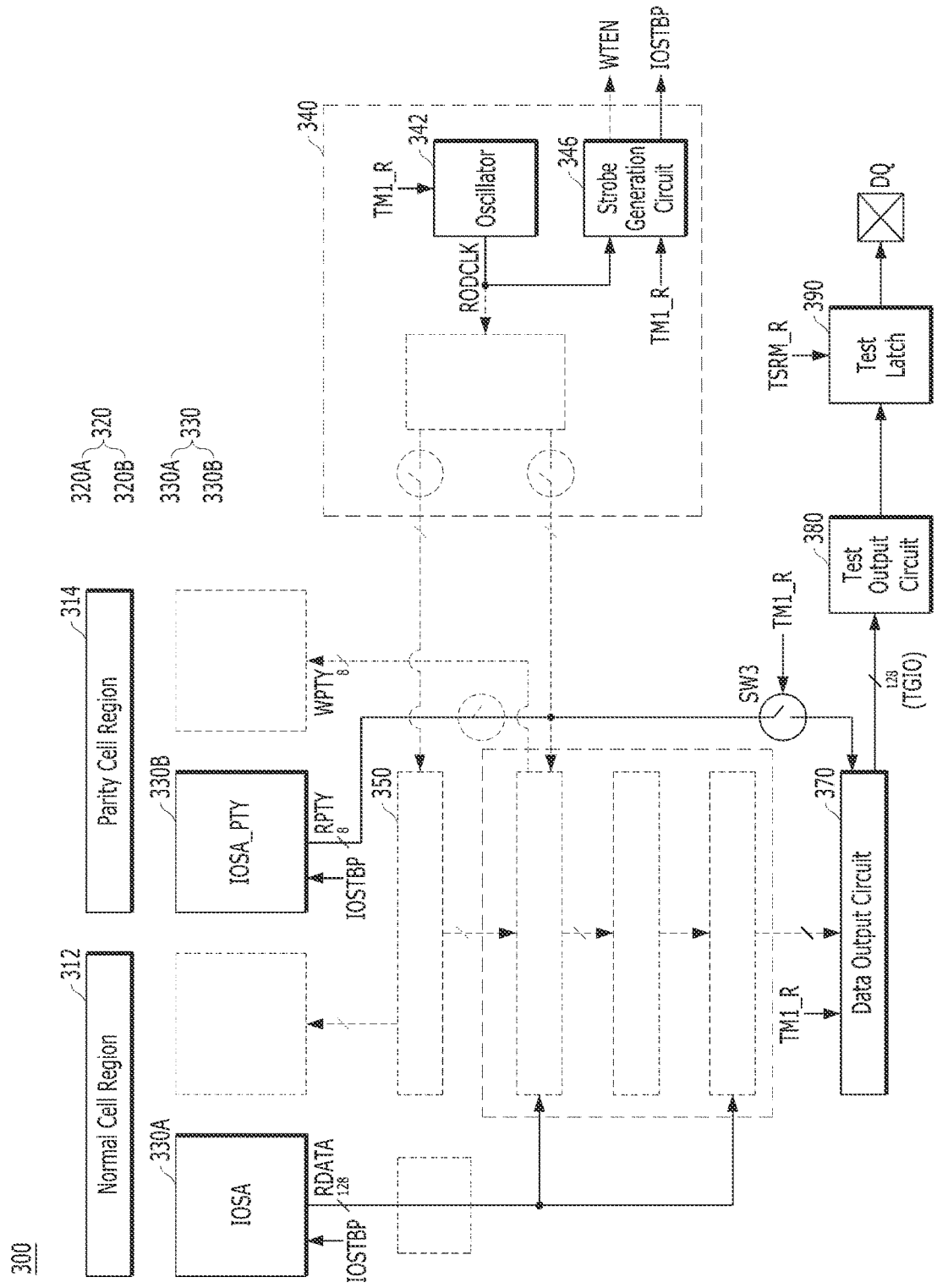

FIGS. 10A and 10B are block diagrams illustrating a test operation for verifying an encoding operation of the error correction circuit 360 shown in FIG. 9.

Referring to FIG. 10A, the first test mode signal TM1 corresponding to the test write signal TM1_W may be activated and thus a test write operation may be performed.

The oscillator 342 of the pattern generation circuit 340 may generate a test clock RODCLK that toggles at a set frequency or cycle. The counter 344 may generate 128-bit test data TPH_D whose value is sequentially increased by counting cycles or toggles of the test clock RODCLK. The third coupling circuit SW5 may provide the data input circuit 350 with the test data TPH_D. The strobe generation circuit 346 may activate the write enable signal WTEN whenever the test clock RODCLK toggles.

The data input circuit 350 may receive the test data TPH_D as write data WDATA and provide the write data WDATA to the normal write circuit 320A and the parity encoder 362. The parity encoder 362 may receive the write data WDATA and generate write parity bits WPTY. The write circuit 320 may write the write data WDATA and the write parity bits WPTY into the normal cell region 312 and the parity cell region 314 according to the write enable signal WTEN, respectively.

Referring to FIG. 10B, the first test mode signal TM1 corresponding to the test read signal TM1_R may be activated and thus a test read operation may be performed.

The pattern generation circuit 340 may activate the read strobe signal IOSTBP whenever the test clock RODCLK toggles. The read circuit 330 may read the read data RDATA and the read parity bits RPTY from the normal cell region 312 and the parity cell region 314 according to the read strobe signal IOSTBP. In this case, the first coupling circuit SW3 may transfer the 8-bit read parity bits RPTY to the data output circuit 370. The data output circuit 370 may map the 8-bit read parity bits RPTY to some lines of 128 test data lines TGIO, and the test output circuit 380 may compare the read parity bits RPTY transferred to the test data line TGIO with the target test pattern to compress a comparison result, and output one-bit compressed data TGIOSUM indicating a pass/failure. The test latch 390 may latch the compressed data TGIOSUM and output the latched data to the data pad DQ according to the test output signal TSRM_R.

Figure 11:
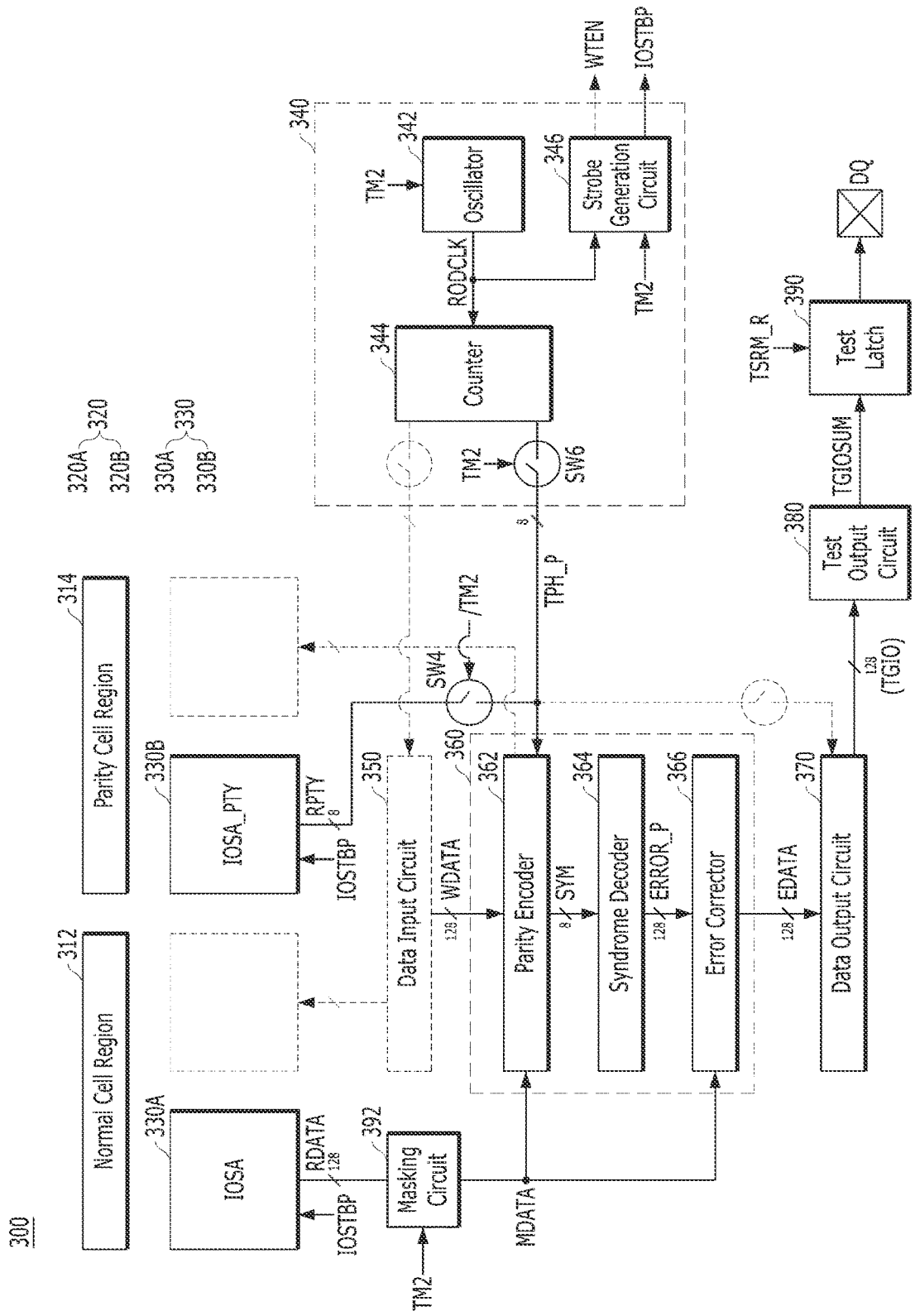
FIG. 11 is a block diagram illustrating a test operation for verifying a decoding operation of an error correction circuit, such as that shown in FIG. 9.

FIG. 11 is a block diagram illustrating a test operation for verifying a decoding operation of the error correction circuit 360 shown in FIG. 9.

Referring to FIG. 11, when the second test mode signal TM2 is activated, the oscillator 342 of the pattern generation circuit 340 may generate a test clock RODCLK that toggles at a set frequency or cycle. The counter 344 may generate 8-bit test data TPH_P whose value is sequentially increased by counting cycles or toggles of the test clock RODCLK, and the fourth coupling circuit SW6 may provide the parity encoder 362 with the test data TPH_P. The strobe generation circuit 346 may activate the read strobe signal IOSTBP whenever the test clock RODCLK toggles. Herein, the masking circuit 392 may mask the read data RDATA and output all-zero or all-high data as the masked data MDATA. The second coupling circuit SW4 may perform masking so that the read parity bits RPTY are not transferred to the parity encoder 370.

The parity encoder 362 may generate a syndrome SYM based on the masked data MDATA and the test data TPH_P, and the syndrome decoder 364 may generate a 128-bit error flag ERR_P indicating error position information of the masked data MDATA by decoding the syndrome SYM. The error corrector 366 may correct an error of the 128-bit read data RDATA based on the error flag ERR_P according to a predefined error correction technique, and output 128-bit error-corrected data EDATA.

The data output circuit 370 may buffer the error-corrected data EDATA and output the buffered data to a test data line TGIO, and the test output circuit 380 may compare the error-corrected data EDATA with a test pattern to compress the error-corrected data EDATA, and output 1-bit compressed data TGIOSUM indicating a pass/failure. The test latch 390 may latch the compressed data TGIOSUM and output the latched data to a data pad according to a test output signal TSRM_R.

In the above embodiments of the present invention, a test operation performed in one bank is described. A structure for performing a test operation of a memory device having two or more multi-banks is described below.

Figure 12:
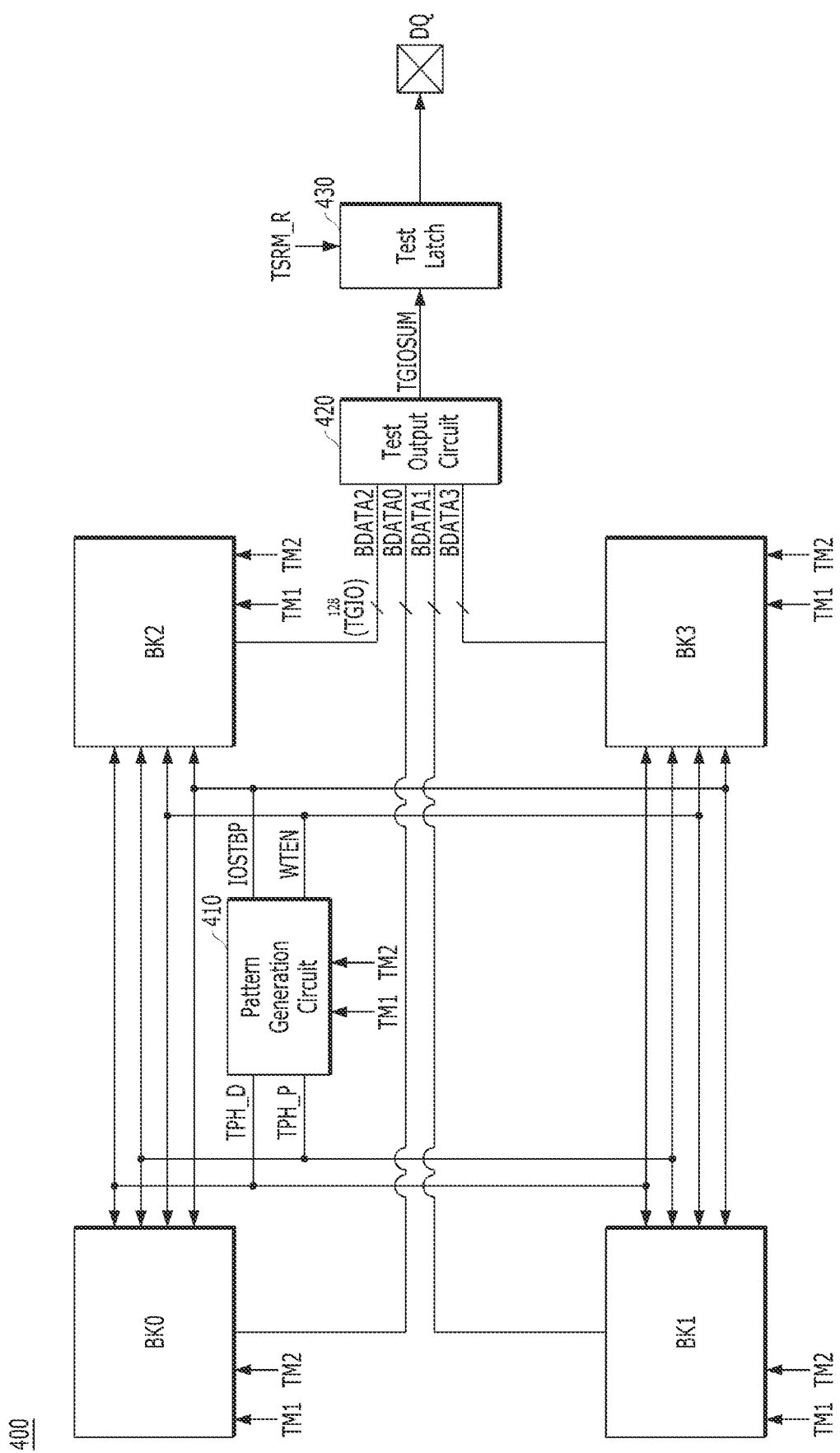
FIG. 12 is a block diagram illustrating a structure of a memory device having a multi-bank structure in accordance with an embodiment of the present invention.

FIG. 12 is a block diagram illustrating a structure of a memory device 400 having a multi-bank structure in accordance with an embodiment of the present invention.

Referring to FIG. 12, the memory device 400 may include first to fourth memory banks BK0 to BK3, a pattern generation circuit 410, a test output circuit 420, and a test latch 430. In other words, each of the first to fourth memory banks BK0 to BK3 may have a structure in which the pattern generation circuit 340, the test output circuit 380, and the test latch 390 are excluded from the memory device 300 of FIG. 9. The memory device 400 may include a normal cell region 312, a parity cell region 314, a write circuit 320, a read circuit 330, a data input circuit 350, an error correction circuit 360, and a data output circuit 370, a masking circuit 392, and first and second coupling circuits SW3 and SW4.

The pattern generation circuit 410 may generate test data TPH_D whose value is sequentially increases when a first test mode signal TM1 is activated, and generate test data TPH_P whose value is sequentially increased when a second test mode signal TM2 is activated. Also, when the first test mode signal TM1 or the second test mode signal TM2 is activated, the pattern generation circuit 410 may generate a write enable signal WTEN indicating a test write operation, and then generate a read strobe signal IOSTBP indicating test read operation. The pattern generation circuit 410 may have substantially the same structure as the pattern generation circuit 340 of FIG. 9.

When the first test mode signal TM1 is activated, each of the first to fourth memory banks BK0 to BK3 may receive test data TPH_D, the write enable signal WTEN, and the read strobe signal IOSTBP from the pattern generation circuit 410, perform an encoding operation described in FIGS. 10A and 10B, and map and output the 8-bit read parity bits RPTY to some lines of the test data lines TGIO. Also, when the second test mode signal TM2 is activated, each of the first to fourth memory banks BK0 to BK3 may receive the test data TPH_P and the read strobe signal IOSTBP from the pattern generation circuit 410, and output the 128-bit error-corrected data EDATA generated based on the masked data MDATA and the test data TPH_P, which are described above with reference to FIG. 11, to the test data line TGIO.

The test output circuit 420 may compress data BDATA0 to BDATA3 transferred from each bank through the test data line TGIO and output compressed data TGIOSUM. The test latch 430 may latch the compressed data TGIOSUM and output the latched data to one among the data pads DQ based on the test output signal TSRM_R.

According to an embodiment of the present invention, a memory device employing an on-chip ECC scheme may perform a test operation at any speed (e.g., high or low) independent of the speed of an external clock by detecting defects that may occur in an error correction circuit based on an internally generated clock.

According to an embodiment of the present invention, a memory device employing an on-chip ECC scheme may verify an error correction circuit only without accessing a cell region. Thus, it may reduce the time taken for performing a test operation while detecting a defect in an error correction circuit itself at the same time.

According to an embodiment of the present invention, a memory device employing an on-chip ECC scheme may reduce the time taken for performing a test operation by compressing and outputting output data of a plurality of banks simultaneously. Also, the test time may be further reduced by testing not only the normal cell region and the parity cell region but also the parity generating circuit together.

While the present invention has been illustrated and described with respect to specific embodiments, it will be apparent to those skilled in the art that various changes and modifications may be made without departing from the spirit and scope of the invention as defined in the following claims.

What is claimed is:

1. A memory device, comprising:
 a normal cell region suitable for storing and outputting data;
 a parity cell region suitable for storing and outputting parity bits;
 a pattern generation circuit suitable for generating a test data whose value is sequentially increased, in a first test mode;
 an error correction circuit suitable for generating the parity bits based on the test data, the parity bits to be stored in the parity cell region, in the first test mode; and
 an output circuit suitable for compressing the parity bits output from the parity cell region to output compressed data, in the first test mode.

2. The memory device of claim 1, further comprising: a test latch suitable for latching the compressed data and outputting latched data to a data pad according to a test output signal.

3. The memory device of claim 1, wherein the output circuit includes:
 a data output circuit suitable for mapping and outputting, in the first test mode, the parity bits to some lines among test data lines; and a test output circuit suitable for compressing, in the first test mode, the parity bits on the test data lines to output the compressed data.

4. The memory device of claim 1, further comprising: a first coupling circuit suitable for transferring the parity bits output from the parity cell region to the output circuit in the first test mode.

5. The memory device of claim 1, wherein the pattern generation circuit includes:
an oscillator suitable for generating a test clock that toggles at a set frequency according to a first test mode signal; and
a counter suitable for generating the test data by counting toggles of the test clock.

6. The memory device of claim 5, wherein the pattern generation circuit further includes: a strobe signal generation circuit suitable for generating a write enable signal indicating a test write operation according to the test clock and then generating a read strobe signal indicating a test read operation, when the first test mode signal is activated.

7. The memory device of claim 6, further comprising:
a write circuit suitable for writing the test data and the parity bits generated by the error correction circuit into the normal cell region and the parity cell region respectively according to the write enable signal; and
a read circuit suitable for reading out the data and the parity bits from the normal cell region and the parity cell region respectively according to the read strobe signal.

8. The memory device of claim 1, further comprising:
a masking circuit suitable for masking the data output from the normal cell region as all-zero or all-high data and outputting masked data in a second test mode; and
a second coupling circuit suitable for controlling the parity bits output from the parity cell region not to be transferred to the error correction circuit in the second test mode,
wherein the pattern generation circuit is further suitable for providing the test data in the second test mode,
wherein the error correction circuit is further suitable for correcting an error of the masked data based on the test data, and outputting error-corrected data, in the second test mode, and
wherein the output circuit compresses the error-corrected data to output compressed error-corrected data in the second test mode.

9. The memory device of claim 8, wherein the pattern generation circuit includes:
an oscillator suitable for generating a test clock that toggles at a set frequency according to a first test mode signal or a second test mode signal;
a counter suitable for generating the test data by counting toggles of the test clock;
a third coupling circuit suitable for providing the test data to the error correction circuit according to the first test mode signal; and
a fourth coupling circuit suitable for providing the test data to the error correction circuit according to the second test mode signal.

10. The memory device of claim 8, wherein the error correction circuit includes:
a parity encoder suitable for generating the parity bits based on the test data in the first test mode, and generating a syndrome based on the masked data and the test data in the second test mode;
a syndrome decoder suitable for detecting a position of an error in the masked data based on the syndrome; and
an error corrector suitable for correcting the error of the masked data based on the detected error position.

11. A memory device, comprising:
a plurality of banks, each bank including:
a normal cell region suitable for storing and outputting data,
a parity cell region suitable for storing and outputting parity bits,
an error correction circuit suitable for generating the parity bits based on a test data, the parity bits to be stored in the parity cell region, in a first test mode, and
a data output circuit suitable for mapping and outputting, in the first test mode, the parity bits output from the parity cell region to some lines among test data lines;
a pattern generation circuit suitable for generating the test data whose value is sequentially increased and providing the test data to the each bank, in the first test mode; and
a test output circuit suitable for compressing, in the first test mode, the parity bits on the test data lines to output compressed data.

12. The memory device of claim 11, further comprising a test latch suitable for latching the compressed data and outputting latched data to a data pad according to a test output signal.

13. The memory device of claim 11, wherein the pattern generation circuit includes:
an oscillator suitable for generating a test clock that toggles at a set frequency according to a first test mode signal;
a counter suitable for generating the test data by counting toggles of the test clock; and
a strobe signal generation circuit suitable for generating a write enable signal indicating a test write operation according to the test clock and then generating a read strobe signal indicating a test read operation, when the first test mode signal is activated.

14. The memory device of claim 13, further comprising:
a write circuit suitable for writing the test data and the parity bits generated by the error correction circuit into the normal cell region and the parity cell region respectively according to the write enable signal; and
a read circuit suitable for reading out the data and the parity bits from the normal cell region and the parity cell region respectively according to the read strobe signal.

15. The memory device of claim 11, wherein each of the banks further includes: a first coupling circuit suitable for transferring the parity bits output from the parity cell region to the data output circuit in the first test mode.

16. The memory device of claim 11, wherein each of the bank further includes:
a masking circuit suitable for masking the data output from the normal cell region as all-zero or all-high data and outputting masked data in a second test mode; and
a second coupling circuit suitable for controlling the parity bits output from the parity cell region not to be transferred to the error correction circuit in the second test mode,
wherein the pattern generation circuit is further suitable for providing the test data to each bank in the second test mode,
wherein the error correction circuit is further suitable for correcting an error of the masked data based on the test data, and outputting error-corrected data, in the second test mode, and wherein the data output circuit is further suitable for outputting the error-corrected data to the test data lines, in the second test mode.

17. The memory device of claim 16, wherein the pattern generation circuit includes:
   an oscillator suitable for generating a test clock that toggles at a set frequency according to a first test mode signal or a second test mode signal;
   a counter suitable for generating the test data by counting toggles of the test clock;
   a third coupling circuit suitable for providing the test data to the error correction circuit the first test mode signal; and
   a fourth coupling circuit suitable for providing the test data to the error correction circuit according to the second test mode signal.

18. The memory device of claim 16, wherein the error correction circuit includes:
   a parity encoder suitable for generating the parity bits based on the test data in the first test mode, and generating a syndrome based on the masked data and the test data in the second test mode;
   a syndrome decoder suitable for detecting a position of an error in the masked data based on the syndrome; and
   an error corrector suitable for correcting the error of the masked data based on the detected error position.

19. A method for testing a memory device including a normal cell region and a parity cell region, the method comprising:
   generating a test data whose value is sequentially increased;
   outputting masked data by masking data output from the normal cell region;
   outputting error-corrected data by correcting an error of the masked data, the error of the masked data being based on the test data;
   generating compressed data by compressing the error-corrected data; and
   latching the compressed data and outputting latched data to a data pad according to a test output signal.

20. The method of claim 19, wherein the generating of the test data includes:
   generating a test clock that toggles at a set frequency; and
   generating the test data by counting toggles of the test clock.

21. The method of claim 19, wherein the correcting an error of the masked data includes:
   generating a syndrome based on the masked data and the test data;
   detecting a position of an error in the masked data based on the syndrome; and
   correcting the error of the masked data according to the detected error position.

* * * * *